(12) United States Patent
Beppu et al.

(10) Patent No.: US 9,899,576 B2
(45) Date of Patent: Feb. 20, 2018

(54) LIGHT EMITTING DEVICE AND METHOD FOR MANUFACTURING THE SAME

(71) Applicant: Nichia Corporation, Anan-shi (JP)

(72) Inventors: Suguru Beppu, Anan (JP); Takuya Noichi, Kaifu-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/454,492

(22) Filed: Aug. 7, 2014

(65) Prior Publication Data

US 2014/0346548 A1 Nov. 27, 2014

Related U.S. Application Data

(63) Continuation of application No. 13/429,229, filed on Mar. 23, 2012, now Pat. No. 8,835,957.

(30) Foreign Application Priority Data

Mar. 24, 2011 (JP) .................................. 2011-065866
May 17, 2011 (JP) .................................. 2011-110876
Mar. 21, 2012 (JP) .................................. 2012-064081

(51) Int. Cl.
  *H01L 33/50* (2010.01)
  *H01L 33/60* (2010.01)
  *H01L 33/44* (2010.01)

(52) U.S. Cl.
  CPC ............ *H01L 33/505* (2013.01); *H01L 33/60* (2013.01); *H01L 33/44* (2013.01); *H01L 2224/13* (2013.01); *H01L 2933/0041* (2013.01)

(58) Field of Classification Search
  CPC .......... H01L 33/60; H01L 33/50; H01L 33/44; H01L 33/505; H01L 2933/0041; H01L 33/52; H01L 33/56; H01L 2933/005
  See application file for complete search history.

(56) References Cited

U.S. PATENT DOCUMENTS

| 6,650,044 | B1* | 11/2003 | Lowery ................. H01L 33/505 313/498 |
| 2002/0187571 | A1* | 12/2002 | Collins et al. .................. 438/29 |
| 2003/0141510 | A1 | 7/2003 | Brunner et al. |
| 2003/0189829 | A1* | 10/2003 | Shimizu et al. .............. 362/240 |
| 2003/0201451 | A1* | 10/2003 | Suehiro et al. ................. 257/98 |

(Continued)

FOREIGN PATENT DOCUMENTS

DE   1020040 53 116 A1   5/2006
EP      1 267 424 A2   12/2002
(Continued)

OTHER PUBLICATIONS

European Search Report Application No. 12 16 1019 dated Sep. 5, 2012.
(Continued)

*Primary Examiner* — Tucker J Wright
(74) *Attorney, Agent, or Firm* — Foley & Lardner LLP

(57) ABSTRACT

A light emitting device includes a light emitting element having electrodes on a lower surface side thereof; a phosphor layer covering a surface of the light emitting element; a transparent covering member disposed on at least one side surface of the light emitting device; and a reflection member that covers the covering member.

30 Claims, 6 Drawing Sheets

(56) References Cited

U.S. PATENT DOCUMENTS

| | | | |
|---|---|---|---|
| 2003/0230751 A1* | 12/2003 | Harada | 257/80 |
| 2005/0014302 A1 | 1/2005 | Brunner et al. | |
| 2005/0218421 A1* | 10/2005 | Andrews et al. | 257/100 |
| 2006/0092644 A1* | 5/2006 | Mok et al. | 362/327 |
| 2006/0255355 A1 | 11/2006 | Brunner et al. | |
| 2007/0045761 A1* | 3/2007 | Basin et al. | 257/440 |
| 2007/0170454 A1 | 7/2007 | Andrews | |
| 2007/0181895 A1* | 8/2007 | Nagai | H01L 33/0079 257/98 |
| 2008/0023711 A1 | 1/2008 | Tarsa et al. | |
| 2008/0130290 A1* | 6/2008 | Ohashi et al. | 362/296 |
| 2009/0194776 A1 | 8/2009 | Pachler | |
| 2009/0236619 A1 | 9/2009 | Chakroborty | |
| 2009/0321770 A1* | 12/2009 | Ajiki | H01L 33/46 257/98 |
| 2010/0283062 A1* | 11/2010 | Hsieh | H01L 21/6835 257/79 |
| 2010/0308354 A1* | 12/2010 | David et al. | 257/98 |
| 2011/0025190 A1* | 2/2011 | Jagt | 313/499 |
| 2011/0051411 A1* | 3/2011 | Kim | G02F 1/133603 362/235 |
| 2012/0025218 A1 | 2/2012 | Ito et al. | |
| 2012/0235169 A1 | 9/2012 | Seko et al. | |
| 2013/0037842 A1 | 2/2013 | Yamada et al. | |

FOREIGN PATENT DOCUMENTS

| | | |
|---|---|---|
| JP | 2003-069086 | 3/2003 |
| JP | 2007-019096 A | 1/2007 |
| JP | 2008-258334 | 10/2008 |
| JP | 2010-157638 A | 7/2010 |
| JP | 2010-219324 A | 9/2010 |
| JP | 2010-238846 A | 10/2010 |
| WO | WO-01/82385 A1 | 11/2001 |
| WO | WO-2010/035206 A1 | 4/2010 |
| WO | WO-2011/099384 A1 | 8/2011 |

OTHER PUBLICATIONS

U.S. Office Action dated Jan. 29, 2014 issued in U.S. Appl. No. 13/429,229.

Japanese Office Action issued in application No. 2012-064081 dated Nov. 24, 2015.

* cited by examiner

LIGHT EMITTING DEVICE AND METHOD FOR MANUFACTURING THE SAME

CROSS-REFERENCE TO RELATED PATENT APPLICATIONS

This application is a Continuation of U.S. application Ser. No. 13/429,229, filed on Mar. 23, 2012, which claims the benefit of Japanese Application No. 2011-065866, filed Mar. 24, 2011, Japanese Application No. 2011-110876, filed May 17, 2011, and Japanese Application No. 2012-064081, filed Mar. 21, 2012, the contents of which are hereby incorporated by reference in their entireties.

BACKGROUND OF THE INVENTION

Field of the Invention

The present invention relates to a light emitting device including a light emitting element and a phosphor layer, and a method for manufacturing the same.

Description of the Related Art

Generally, a light emitting device using a light emitting element such as a light emitting diode (LED) has electronic parts such as a light emitting element and a protection element, a substrate on which the elements are positioned, and a transparent resin for protecting the light emitting element, the protection element and the like.

A technique is known in which, for the purpose of causing the light emitting device to emit white light, a concave portion is provided on the substrate, a light emitting element for emitting blue light is positioned in the concave portion, and a transparent resin including a phosphor is provided so that the phosphor covers the light emitting element in the concave portion. In the light emitting device, a wavelength of a portion of the blue light output from the light emitting element is converted by the phosphor, and yellow light resulting from the wavelength conversion is mixed with the blue light from the light emitting element, thereby emitting white light. However, in this way, it is hard to obtain uniform white light because a difference occurs in the quantity of blue light absorbed by the phosphor according to difference in a length of an optical path of the blue light from the light emitting element. Since the phosphor included in the transparent resin in the concave portion is excited to emit light, a light emitting area becomes larger.

On the other hand, JP-A-2003-69086 discloses a method for forming a phosphor layer having a uniform thickness on the light emitting element by using a so-called electrodeposition method. Accordingly, difference in the length of the optical path of the blue light can be reduced. In the light emitting device provided with the phosphor layer formed thereon by the electrodeposition method, the light emitting device can have light distribution characteristics close to that of a point light source since the phosphor layer can be formed very near to the light emitting element. The point light source has an advantage of enabling easy design of an application product to which the point light source is installed since the point light source has a small light emitting area. Accordingly, an expansion of the use thereof is expected in various fields including the lighting apparatus field.

In the electrodeposition method, the phosphor particles deposit on a surface of the light emitting element by applying an electric field in a bath liquid containing phosphor particles deposits. However, according to the electrodeposition method, an electrically conductive wiring pattern exposed around the light emitting element is also covered with the phosphor particles. Therefore, light emitted from the phosphor layer provided on the surface of the light emitting element may be absorbed by the phosphor layer provided on the wiring pattern around the light emitting element. Further, light emission from the phosphor layer provided on the wiring pattern may induce uneven light emission.

JP-A-2003-69086 proposes forming a photoresist on the wiring pattern so as to prevent the phosphor particles from adhering onto the wiring pattern. However, the proposal requires additional steps for forming and removing the photoresist. Further, in JP-A-2003-69086, the light emitted from the light emitting element is absorbed by the wiring pattern around the light emitting element, which lowers light extraction efficiency.

In many cases, the light emitting element is bonded to a substrate by way of a metallurgy bump and the like. In the bonding process, a small space is created between the light emitting element and the substrate. It is difficult to completely fill the space between the light emitting element and the substrate with the phosphor particles, and thus a density of the phosphor particles tends to be lower than that of the other areas. As a result, light from the light emitting element may leak therefrom.

SUMMARY OF THE INVENTION

Thus, an object of the present invention is to provide a light emitting device that has satisfactory light extraction efficiency and enables uniform light emission, and a method for manufacturing the same.

According to the present invention, a light emitting device includes a substrate having a conductive portion; a light emitting element having one or more electrodes on a lower surface side thereof, the electrodes being positioned on the conductive portion of the substrate; a phosphor layer for covering a surface of the light emitting element and a peripheral surface area of the conductive portion next to the light emitting element; and a reflection layer for covering a part of the phosphor layer formed on the peripheral surface area of the conductive portion.

The reflection layer may be positioned lower than an upper surface of the light emitting element.

The reflection layer preferably may cover an outer end of the part of the phosphor layer formed on the peripheral surface area of the conductive portion.

The conductive portion may have an opening surrounding the light emitting element, the substrate being exposed at the opening; the part of the phosphor layer formed on the peripheral surface area of the conductive portion may be separated from other part of the phosphor layer formed on the surface of the light emitting element by the opening; and the reflective layer may cover an exposed area of the substrate at the opening.

The light emitting element further may include a luminescent layer, and the reflection layer may be positioned lower than the luminescent layer.

According to the present invention, a method for manufacturing a light emitting device includes: connecting one or more electrodes of a light emitting element to a conductive portion of a substrate; forming a phosphor layer to cover at least the light emitting element on the substrate; and forming a reflection layer on a part of the phosphor layer around the light emitting element.

The forming of the phosphor layer may be conducted by forming the phosphor layer on a surface of the light emitting element and a peripheral surface area of the conductive portion next to the light emitting element; and the forming of the reflection layer may be conducted by forming the reflection layer on a part of the phosphor layer formed on the peripheral surface area of the conductive portion.

The phosphor layer may be formed by an electrodeposition method or an electrostatic coating method.

The reflection layer may be formed by an electrodeposition method or an electrostatic coating method.

In addition, the method may include: forming a covering layer having conductivity on the surface of the light emitting element before the forming of the phosphor layer, the phosphor layer being formed on a surface of the covering layer and a peripheral surface area of the conductive portion next to the light emitting element; and reforming the covering layer so as to have insulating property after the forming of the phosphor layer, the reflection layer being formed on a part of the phosphor layer formed on the peripheral surface area of the conductive portion.

According to the present invention, it is possible to provide a light emitting device that has satisfactory light extraction efficiency and enables uniform light emission, and a method for manufacturing the same. According to the light emitting device of the present invention, it is also possible to provide a light emitting device having light distribution characteristics close to that of the point light source.

DETAILED DESCRIPTION OF THE PREFERRED EMBODIMENTS

A light emitting device and a method for manufacturing the light emitting device for carrying out the present invention will be described below with reference to the accompanying drawings.

First Embodiment

Figure 1:
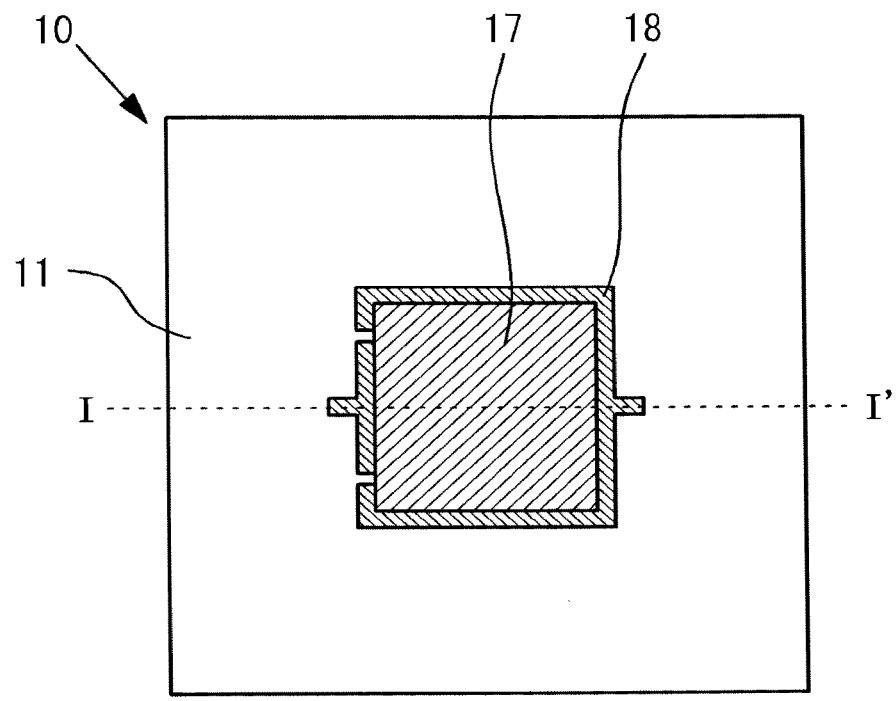
FIG. 1 is a schematic plan view showing an example of present invention.
Figure 2:
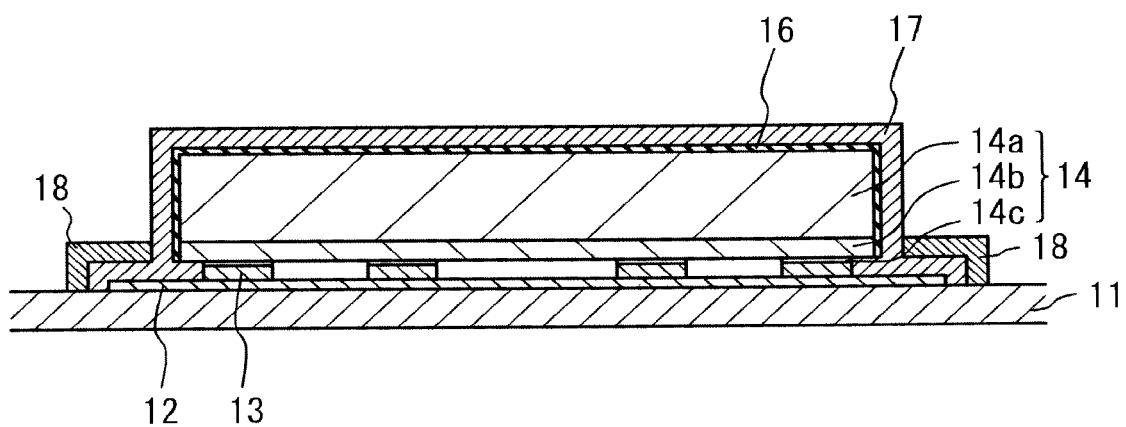
FIG. 2 is a schematic cross-sectional view of the light emitting device taken along line I-I' of FIG. 1.

FIG. 1 is a schematic plan view showing an example of a light emitting device according to a first embodiment of the present invention. FIG. 2 is a schematic cross-sectional view of the light emitting device taken along line I-I' of FIG. 1.

A light emitting device 10 according to the present embodiment includes a substrate 11 having a conductive portion 12, a light emitting element 14, a phosphor layer 17, and a reflection layer 18.

The substrate 11 is shaped into a substantially plate-like shape and has the conductive portion 12 on a part thereof. The light emitting element 14 includes a semiconductor layer 14b including a luminescent layer formed on one main surface of a transparent substrate 14a having a pair of opposing main surfaces. The light emitting element 14 further has a positive electrode and a negative electrode (hereinafter referred to as "electrodes 14c") formed on a surface of the semiconductor layer 14b. In the light emitting device of the first embodiment, the light emitting element 14 is positioned such that the substrate 14a side opposing an electrode forming surface becomes a main light-extracting surface. In FIG. 1, the other main surface of the substrate 14a is an upper surface of the light emitting element 14. The semiconductor layer 14b is formed on the one main surface side of the substrate 14a, and the electrodes 14c are formed on a lower surface side of the semiconductor layer 14b. The electrodes 14c of the light emitting element 14 are positioned on the conductive portion 12 formed on the substrate 11 by way of bonding members 13. On the substrate 11, a phosphor layer 17 covers a surface of the light emitting element 14 and a peripheral surface area of the conductive portion 12 exposed around the light emitting element 14. The reflection layer 18 covers a part of the phosphor layer 17 formed on the peripheral surface area of the conductive portion 12 around the light emitting element 14.

A configuration of each component of the light emitting device according to the present embodiment is briefly described below.

(Substrate)

The substrate is intended for positioning electronic parts such as a light emitting element and a protection element thereon. A shape of the substrate is not particularly limited, and preferably the substrate has a flat upper surface. An example of the shape of the substrate includes a square flat shape.

An insulating substrate can be used. The insulating substrate is preferably formed of, but not limited to, ceramics made of, for example, alumina and aluminum nitride. A glass epoxy resin and a thermoplastic resin may also be used instead of ceramics.

The substrate is provided with the conductive portion at least on a surface of the substrate opposing to the electrode of the light emitting element. The conductive portion electrically connects the light emitting element on the substrate with an external power supply. A voltage from the external power supply is applied to the light emitting element through the conductive portion. In the present embodiment, the conductive portion is partially embedded in the substrate and exposed on an upper surface and a lower surface of the substrate. Whereby, power supply from the lower surface to the upper surface of the substrate is possible.

The upper surface of the conductive portion is partially connected with the light emitting element and the other area of the upper surface (i.e. the peripheral surface area) of the conductive portion is exposed around the light emitting element. In case the phosphor layer and the reflection layer are formed by, for example, an electrodeposition method, the phosphor layer and the reflection layer are formed on the peripheral surface area (the exposed area) of the conductive portion.

The conductive portion may be made of a conductive material. The conductive portion is preferably made of the conductive material that is physically and chemically stable. For example, the conductive portion may be made of Au (gold), Ag (silver), and/or Cu (copper).

The conductive portion exposed on the upper surface of the substrate is preferably made of a material having high conductivity for the purpose of releasing heat from the light emitting element and is widely formed around the area in which the light emitting element is positioned. With the structure, heat generated from the light emitting element can be released from a wide area on a mounting surface (i.e. the upper surface) of the substrate.

The heat dissipation can be improved by thickening the conductive portion. A thickness of the conductive portion exposed on the upper surface of the substrate is preferably about a range between 5 μm and 80 μm.

In case the ceramics is used for forming the substrate, the substrate can be manufactured by either one of a post firing method (i.e., sequential firing method) or a co-firing method (i.e., simultaneous firing method). The post firing method is a method of forming the conductive portion on a preliminary fired ceramic plate having a large diameter. On the other hand, the co-firing method is a method of firing the ceramic plate and the conductive portion at the same time. The ceramic plate is manufactured by firing a ceramic precursor sheet called a "green sheet." However, a dimensional shrinkage occurs during the firing of the green sheet. A size of the green sheet is designed in prospect of the shrinkage thereof during the firing. However, dimensional accuracy of the ceramic plate fired by the co-firing method is lower than that by the post firing method. Therefore, when a below described lens is formed on the substrate, such a problem arises that a position of the lens is shifted from a predetermined position because a size of die for forming the lens does not match that of the ceramic plate. In view of the above, to obtain the ceramic plate (i.e. the substrate) having the improved dimensional accuracy, the post firing is preferred to be employed. In case the conductive portion is formed by the post firing method, a fine pattern can be formed by a vacuum deposition method or a sputtering method in which liftoff is performed by using the photolithographic technique. On the other hand, the co-firing method has advantages that adhesiveness between the ceramic plate and the conductive portion improves as well as a manufacturing cost can be saved because the ceramic plate and the conductive portion are fired at once. A part of the conductive portion embedded in the substrate may be formed by the co-firing method and subsequently the other part of the conductive portion exposed on the upper surface and/or the lower surface of the substrate may be formed by the post firing method. In this case, even in case the part of the conductive portion is embedded into the substrate, the dimensional accuracy can be ensured as well as the manufacturing cost can be saved. In the co-firing method, a cavity for accommodating the light emitting element, the protection element, and the like can be easily formed in the substrate by laminating and firing stamped green sheets.

(Light Emitting Element)

The light emitting element is mounted on the conductive portion formed on the substrate. A light emitting diode is preferably used as the light emitting element. Examples of the light emitting element include a laminated structure with a luminescent layer formed on the substrate from various semiconductors such as a nitride semiconductor, e.g., InN, AlN, GaN, InGaN, AlGaN and InGaAlN, a Group III-V compound semiconductor, and a Group II-VI compound semiconductor. Examples of the substrate of the light emitting element include an insulating substrate made of, for example, sapphire and an electrically conductive substrate made of, for example SiC, GaN, and GaAs.

In case the substrate of the light emitting element has insulation property, a covering layer 16 having the conductivity may be required to be formed on the surface of the substrate in order to form the phosphor layer on the surface of the substrate by using the below described electrodeposition method. The covering layer can be removed or reformed so as to have insulating property by oxidization treatment before forming the below described reflection layer. In the latter case, the covering layer is preferably reformed to be transparent or reformed into a member having high transparency by the oxidation. The latter case in which the covering layer is subjected to an oxidation treatment to oxidize the covering layer is preferable since the transparent covering layer 16 having satisfactory adhesive property with respect to the phosphor layer can be formed. The covering layer 16 in this case can be made of, for example, Mg, Al, Si, Zr, Zn, and Pb. When the covering layer 16 is removed before forming the reflection layer, the covering layer 16 is not included in the light emitting device. When the covering layer 16 is reformed so as to have the insulating property before forming the reflection layer, the covering layer 16 is included in the light emitting device as a reformed oxide.

In case the substrate of the light emitting element has the conductivity, a coating layer may be formed on the phosphor layer formed on the light emitting element by using a material having the transparency and the insulation property after forming the phosphor layer in order to prevent the reflection layer to be formed on the light emitting element. In this case, for example, oxides such as $Al_xO_y$ ($1<x$, $1<y$) and $SiO_x$ ($1<x$) and organic substances such as polymethyl methacrylate, polyimide and silicone resin can be used for forming the coating layer.

The electrode of the light emitting element is formed at a position inside the outer edge of the light emitting element. The electrode of the light emitting element can be formed into any shape. In other words, the electrode of the light emitting element can have various shapes such as a substantial square shape and a circular shape. The electrode of the light emitting element may be formed of any material as long as the material can be used for forming the electrode of the element.

(Bonding Members)

Bonding members bond the light emitting element onto the conductive portion formed on the substrate. The bonding members are positioned at least so as to be between the electrode of the light emitting element and the conductive portion. A material that can force the light emitting element into conduction with the conductive portion is used for forming the bonding members. For example, a solder material such as Sn—Cu, Sn—Ag—Cu, and Au—Sn, a metallurgy bump made of Au, and an anisotropic conductive paste can be used as the bonding members.

Since the light emitting element is supported on the conductive portion by way of the bonding members, the lower surface of the semiconductor layer of the light emitting element and the upper surface of the substrate are spaced to each other by a distance corresponding to the sum of a thickness of the bonding member, a thickness of the electrode of the light emitting element, and a thickness of the conductive portion exposed from the upper surface of the substrate, thereby forming a space therebetween.

The sum of the thickness of the bonding member and the thickness of the electrode of the light emitting element is preferably a range between 1 μm and 150 μm. If the sum of the thicknesses becomes equal to or more than 150 μm, it becomes difficult to cover the space in case the phosphor layer and the reflection layer are formed by using the below described electrodeposition method or the like.

(Phosphor Layer)

The phosphor layer converts light from the light emitting element into light having a different wavelength. The phosphor layer may convert the light from the light emitting element to have a shorter wavelength. More preferably, the phosphor layer converts the light from the light emitting element to have a longer wavelength in view of the light extraction efficiency. The phosphor layer is positioned at least on the upper surface and the side surfaces of the light emitting element and the surface of the conductive portion exposed around the area in which the light emitting element is positioned in the upper surface of the substrate. The upper surface and the side surfaces of the light emitting element are covered with the phosphor layer, so that the light emitted from the light emitting element in an upward direction and a side direction can be temporally extracted to a side of the phosphor layer. Therefore, the light absorption in the light emitting element can be reduced.

The phosphor layer is preferably formed to have a substantially uniform thickness. The phosphor layer preferably has a thickness of about a range between 0.1 μm and 100 μm.

Examples of phosphor that forms the phosphor layer include nitride-based phosphor that is activated mainly by a lanthanoid-based element such as Eu and Ce, oxide-based phosphor, more specifically, a or p sialon-type phosphor that is activated by Eu, various types of alkali-earth metal silicate nitride phosphor, phosphor, that mainly activated by a lanthanoid-based element such as Eu and a transition metal-based element such as Mn, such as alkali-earth metal halogen apatite, alkali-earth metal halosilicate, alkali-earth metal silicate, alkali-earth metal halogen borate fluorescent, alkali-earth metal alminate, alkali-earth metal silicate, alkali-earth metal sulfides, alkali-earth metal thiogallate, alkali-earth metal silicon nitride, and germanate, and phosphor, that is activated mainly by a lanthanoid-based element such as Ce, such as rare earth alminate and rare earth silicate or phosphor, that is mainly activated by a lanthanoid-based element such as Eu, such as organo or organic complexes.

There is no particular limitation on the shape of the phosphor, and the shape is preferably a circular shape or a shape similar to the circular shape. The phosphor preferably has an average particle diameter of about a range between 0.1 and 100 μm, more preferably, between 1 and 10 μm.

(Reflection Layer)

The reflection layer covers the phosphor layer formed on the conductive portion and performs the role of controlling degradation of the light extraction efficiency.

Preferably, a reflecting material for forming the reflection layer can reflect the light emitted from the light emitting element or the light of which wavelength is converted by the phosphor layer with satisfactory reflecting efficiency. More preferably, the reflection material can reflect the light more than 90% in its peak wavelength. More preferably, the reflection material hardly transmits and absorbs the light emitted from the light emitting element or the light of which wavelength is converted by the phosphor layer. The reflection material preferably has insulation property.

Use of the material that can reflect light, e.g., particles of $SiO_2$, $TiO_2$, $ZrO_2$, $BaSO_4$, and MgO, as the reflecting material realizes an efficient reflection of the light. The above described materials may be used independently or in a combination of two or more of them.

As described above, in case the phosphor layer is formed by, for example, the below described electrodeposition method, the phosphor particles adhere to a conductive portion exposed on the surface of the light emitting device (i.e., coming into contact with bath liquid for electrodeposition), for example, the surface of the conductive portion exposed around the light emitting element. To the contrary, the reflection layer is formed so as to cover the phosphor layer formed on the conductive portion exposed around the light emitting element. Accordingly, a light loss caused by the light emitted from the phosphor adhered to the surface of the light emitting element being absorbed by the phosphor layer provided on the conductive portion around the light emitting element can be reduced. The light emitted from the phosphor layer formed on the conductive portion can be blocked by the reflection layer and thus the light emitting device can be made closer to a point light source. In case the phosphor layer is formed by, for example, the electrodeposition method, the spaces provided between the lower surface of the semiconductor layer and the upper surface of the substrate cannot be completely covered with the phosphor particles in some cases. The formation of the reflection layer on the phosphor layer provided on the conductive portion enables the reflection layer to cover an area around the spaces, so that the light of the light emitting element can be prevented from leaking through the above described spaces.

The reflection layer preferably covers the phosphor layer formed on the conductive portion in its entirety. As shown in FIG. 1, the reflection layer is preferably formed so as to cover the outer end of the part of the phosphor layer formed on the peripheral surface area of the conductive portion. Accordingly, the above described effect can be manufactured more efficiently.

The reflection layer preferably has a thickness of, for example, about a range between 1 μm and 100 μm. In order to prevent leakage of the light of the light emitting element through the above described spaces, the upper surface of the reflection layer is preferably positioned higher than the lower surface of the semiconductor layer of the light emitting element. Further, with a structure in which the upper surface of the reflection layer is positioned higher than the upper surface (i.e., interface with respect to the substrate) of the semiconductor layer of the light emitting element, the relatively strong light emitted from the side surfaces of the semiconductor layer including the luminescent layer can be blocked by the reflection layer. As a result, color unevenness can be reduced.

The reflection layer is preferably positioned lower than the upper surface of the light emitting element. Accordingly, the light of the light emitting element emitted in the side direction can be extracted to the outside without the light being blocked by the reflection layer. Further, with a configuration in which the upper layer of the reflection layer is positioned lower than the luminescent layer of the light emitting element, the relatively strong light emitted from the side surfaces of the luminescent layer can be extracted to the outside through the phosphor layer and the light absorption by the conductive portion around the light emitting element and the phosphor layer provided thereon can be reduced.

(Impregnated Layer)

In order to prevent separation of the phosphor layer 17 and/or the reflection layer 18, a transparent material may be provided between the particles of the phosphor layer 17 and/or the reflection layer 18, as required. The phosphor layer 17 and/or the reflection layer 18 are preferably impregnated with the transparent material between the particles of the phosphor layer 17 and/or the reflection layer 18 to form an impregnated layer. The impregnated layer may also be formed on the phosphor layer 17 and/or the reflection layer 18 so as to cover the phosphor layer 17 and/or the reflection layer 18. Examples of the transparent material include a silicone resin and an epoxy resin.

No transparent material is provided in a clearance between the lower surface of the light emitting element 14 and the upper surface of the conductive portion 12 (i.e., clearance between the neighboring bonding members 13). In other words, the clearance is preferably left as a space. This is for the purpose of preventing degrading of the joint strength in the bonding area between the light emitting element 14 and the conductive portion 12 caused by, in case the transparent material is made of resin material, deformation of the resin due to a thermal stress applied during the operation and mounting of the light emitting device according to a charge of the resin into a lower section of the light emitting element 14.

In the present embodiment, the phosphor layer 17 is formed on the surface of the conductive portion exposed around the area in which the light emitting element 14 is mounted, so that the phosphor layer 17 formed in the area outside the light emitting element 14 is preferentially impregnated with the excessive resin by impregnating the phosphor layer 17 with the resin as the transparent material. Accordingly, it becomes easy to secure the spaces in the lower section of the light emitting element 14 free from the phosphor layer 17. The transparent material can be formed by any one of a dispensing method, a spraying method, a printing method, a potting method, a casting method, a spin coat method, or the like.

(Method for Manufacturing Light Emitting Device)

The method for manufacturing the light emitting device according to the embodiment of the present invention will be described below by way of the light emitting device according to the first embodiment of the present invention as an example.

Figure 3:
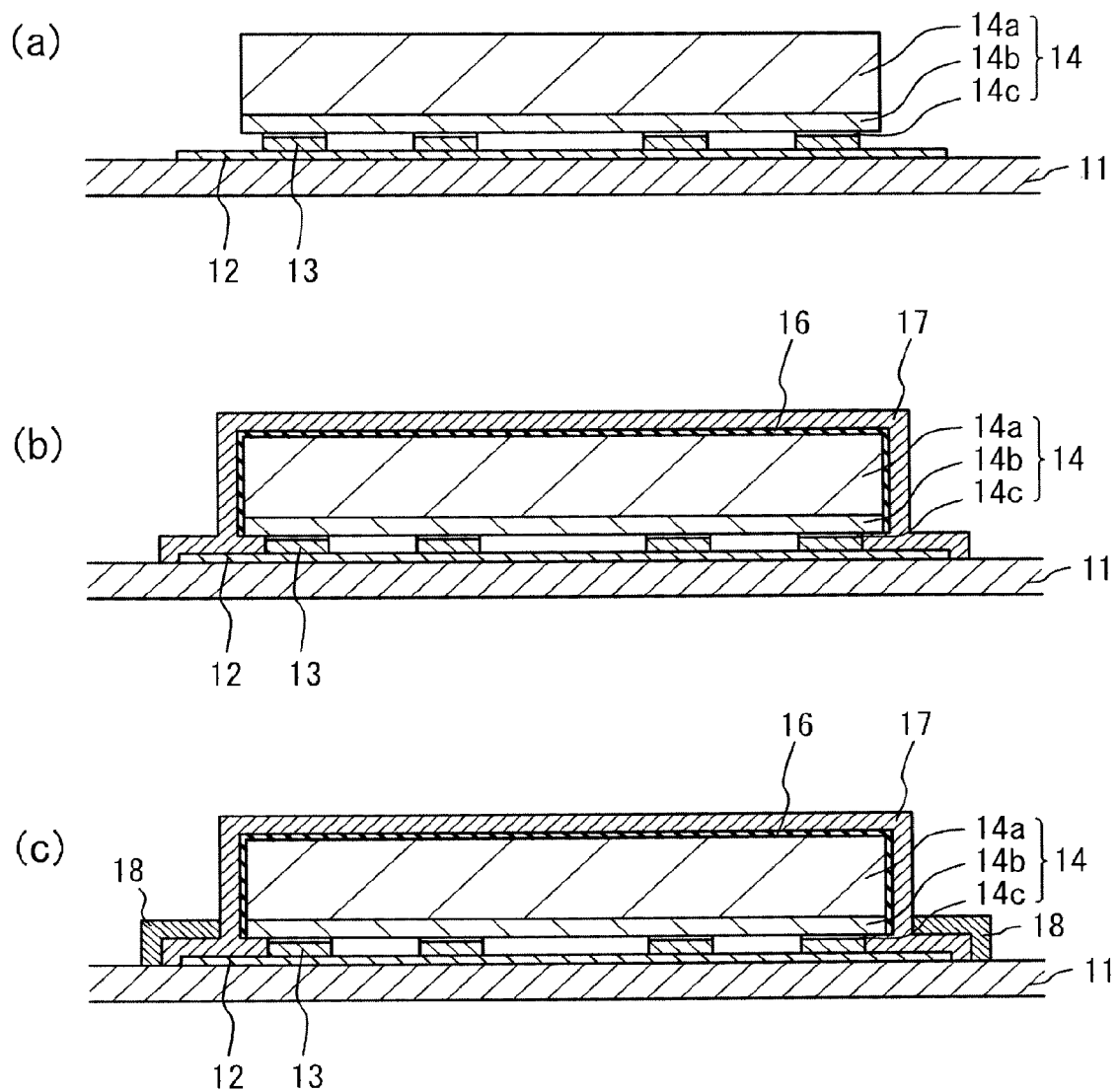
FIG. 3 is a schematic cross-sectional view for explaining an example of a manufacturing process of the light emitting device according to one embodiment of the present invention.

FIG. 3 is a schematic cross-sectional view for explaining an example of the manufacturing process of the light emitting device according to the present embodiment.

First, the substrate 11 including the conductive portion 12 is prepared and the electrodes 14c of the light emitting element 14 is bonded on the conductive portion 12 by way of the bonding members 13. As shown in FIG. 3A, the light emitting element 14 is bonded onto the conductive portion 12 by way of the bonding members 13 such that the conductive portion 12 opposes to the electrodes 14c of the light emitting element 14. A technique for bonding between the conductive portion 12 of the substrate 11 and the light emitting element 14 can be selected according to the bonding members 13. For example, supersonic, heat, load, light, flux, and the like may be used as the bonding technique. In case the solder material is used as the bonding members 13, the peripheral surface area of the conductive portion 12 exposed around the light emitting element 14 acts as a receiving area for the extra solder material. In other words, the conductive portion 12 and the light emitting element 14 can be bonded together with an appropriate amount of the solder material, thereby reducing a defect bonding caused by the excessive amount of the solder material, which makes it possible to realize a stable bonding state.

As shown in FIG. 3B, the phosphor layer 17 is formed on the substrate 11 such that the phosphor layer 17 covers the light emitting element 14. The phosphor layer 17 is formed on the surface of the light emitting element 14 and the peripheral surface area of the conductive portion 12 exposed around the light emitting element 14 at the stage of mounting the light emitting element 14 on the conductive portion 12. The phosphor layer 17 can be formed by (A) a sputtering method, (B) a vacuum deposition method, (C) a precipitation method, (D) a potting method, (E) a printing method, (F) an electrodeposition method, (G) an electrostatic coating method, and the like. By using the above methods, the phosphor layer can be formed on the surface of the light emitting element 14 and the peripheral surface area of the conductive portion 12. In the cases of (A), (B), and (C) methods, the phosphor layer can be adhered onto the entire surfaces of the light emitting element 14 and the substrate 11 without using a binder. In the cases of (D) and (E) methods, use of the phosphor dispersed within the transparent member enables selective adherence of the phosphor. In the cases of (F) and (G) methods, use of a material having conductivity at sections where the phosphor is desired to be adhered enables a selective adherence of the phosphor. The phosphor layer 17 is preferably formed by (F) and (G) methods since the phosphor layer 17 having a thickness of better uniformity can be formed by the methods and the phosphor layer 17 can be formed so as to cover the below described reflection layer 18 near to the light emitting element 14.

The phosphor layer 17 is formed, for example, such that the substrate 11 mounted with the light emitting element 14 is soaked in a solution containing a phosphor (i.e., bath liquid for the use of electrodeposition) and an electrophoresis in the solution causes the phosphor particles to be deposited on the surface of the conductive portion 12 of the substrate 11 and the surface of the light emitting element 14, respectively. In case the surface of the light emitting element is made of a material having conductivity, a voltage is applied to the light emitting element itself to electrophorese the charged phosphor particles. Accordingly, the phosphor particles can be deposited on the light emitting element. Similar to the case of the light emitting element including a semiconductor film and an insulating substrate made of, for example, sapphire laminated together, in case the surface of the light emitting element has a section having non-conductivity, the covering layer 16 having conductivity is provided on the section of the light emitting element 14 having the non-conductivity and, subsequently, a voltage is applied to the covering layer 16 to electrophorese the charged phosphor particles. Accordingly, the phosphor particles can be deposited on the insulating substrate 14a through the covering layer 16. FIG. 3B illustrates a state that the covering layer 16 is formed on the surface of the light emitting element 14. The phosphor layer 17 is formed on the surface of the light emitting element 14 through the covering layer 16. The thickness of the phosphor layer 17 can be controlled according to conditions and time in depositing the phosphor particles, as required.

The covering layer 16 is removed or reformed so as to have the insulating property before forming the reflection layer. Examples of the method for removing or reforming the covering layer 16 include: (1) in order to remove the covering layer 16, adding an agent for selectively dissolving the material of the covering layer in the bath liquid for electrodeposition after the formation of the covering layer; (2) in order to remove the covering layer 16, soaking the covering layer in the solution to dissolve the covering layer after the formation of the phosphor layer; (3) reforming the covering layer so as to have the insulating property by, for example, the oxidation treatment after the formation of the phosphor layer. In the cases of (1) and (2), the covering layer may be dissolved by soaking the covering layer in an acidic-bath liquid such as hydrochloric acid and sulfate or an alkali-bath liquid such as sodium oxide and ammonia. In this case, for example, Al and Zn can be used as the material of the covering layer. In the case of (3), in addition to the reformation of the covering layer so as to have the insulating property, reformation of the covering layer so as to have the transparency or reformation into a member having high transparency is preferred. Examples of the material of the covering layer in this case include Mg, Al, Si, Zr, and Pb. The covering layer can have any thickness as long as the covering layer can be subjected to the above described processes. For example, the thickness of the covering layer can be a range between 100 Å and 10,000 Å.

In case the substrate of the light emitting element has the conductivity, in order to prevent the formation of the reflection layer on the light emitting element, the coating layer may be formed on the phosphor layer formed on the light emitting element by using a material having the transparency and insulating property after the formation of the phosphor layer. Examples of the material of the coating layer to be used in this case include oxides such as $Al_xO_y$ (1<x, 1<y) and $SiO_x$ (1<x), and organic substances such as polymethyl methacrylate, polyimide, and a silicone resin.

As shown in FIG. 3C, the reflection layer 18 is formed around the light emitting element 14. For example, the electrodeposition method and the electrostatic coating method can be used for forming the reflection layer 18. Using these methods, a dense reflection layer 18 can be formed near the light emitting element 14. As shown in FIG. 3C, the reflection layer 18 does not directly contact the conductive portion 12. In the reflection layer 18 having the above structure, for example, the light emitting device is soaked in solution containing a reflection material that forms the reflection layer 18 to electrophorese the charged reflection material in the solution, thereby enabling the reflection material to be deposited on the conductive portion 12 around the light emitting element 14 through the phosphor layer 17. Before forming the reflection layer 18, the covering layer 16 formed on the light emitting element 14 is removed or reformed so as to have the insulating property, so that the reflection layer 18 can be selectively and efficiently formed on the phosphor layer 17 formed on the conductive portion 12 around the light emitting element 14.

The thickness of the reflection layer can be appropriately controlled according to the conditions and time for deposition, as required. However, the thickness of the reflection layer is preferred to be controlled such that the reflection layer is positioned lower than the upper surface of the light emitting element such that the light can be extracted from the side surfaces of the light emitting element.

Second Embodiment

Figure 4:
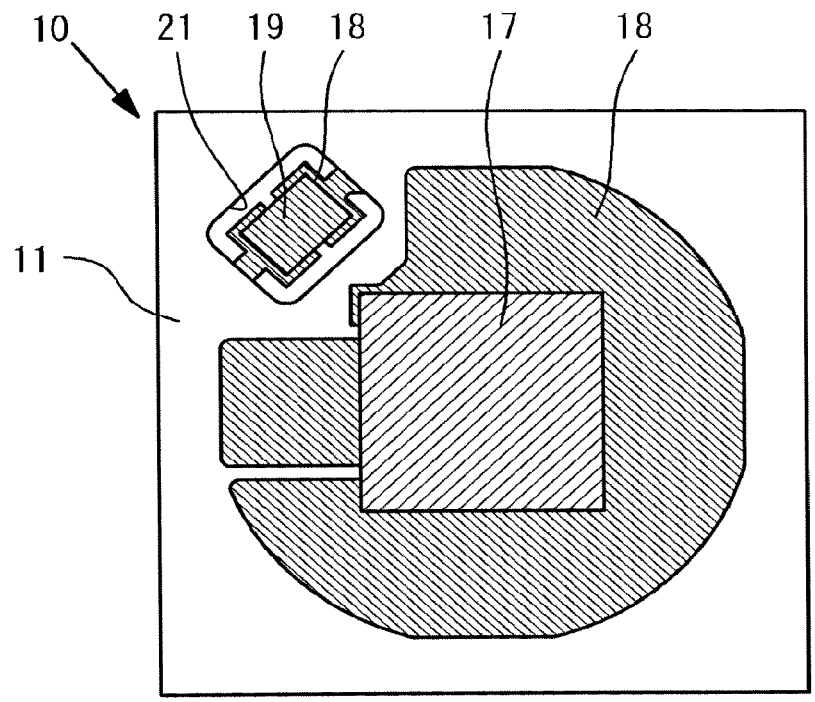
FIG. 4 is a schematic plan view showing an example of a light emitting device according to a second embodiment of the present invention.

FIG. 4 is a schematic plan view showing an example of a light emitting device according to the second embodiment of the present invention. Descriptions of configurations identical to those of the light emitting device according to the first embodiment are omitted.

In the light emitting device 10 according to the present embodiment, a protection element 19 such as a Zener diode is positioned on the substrate 11. The conductive portion 12 is formed on the substrate 11, except for an area where the protection element 19 is positioned, into a substantially circular shape centering the area in which the light emitting element 14 is positioned. The phosphor layer 17 and the reflection layer 18 are formed so as to cover almost the entire exposed area of the conductive portion 12. The reflection layer 18 may be formed so as to cover the protection element 19. Whereby, the light extraction efficiency of the light emitting device of the present embodiment in the upper surface of the substrate can be improved.

In the light emitting device of the present embodiment, a concave portion 21 is formed on the surface of the substrate 11 and the protection element 19 is positioned within the concave portion 21. With this structure, an adverse effect on the light distribution characteristics caused by the irradiation of the light from the light emitting element to the protection element can be suppressed. Accordingly, a light emitting device having improved light extraction efficiency and light distribution characteristics can be provided.

Third Embodiment

Figure 5:
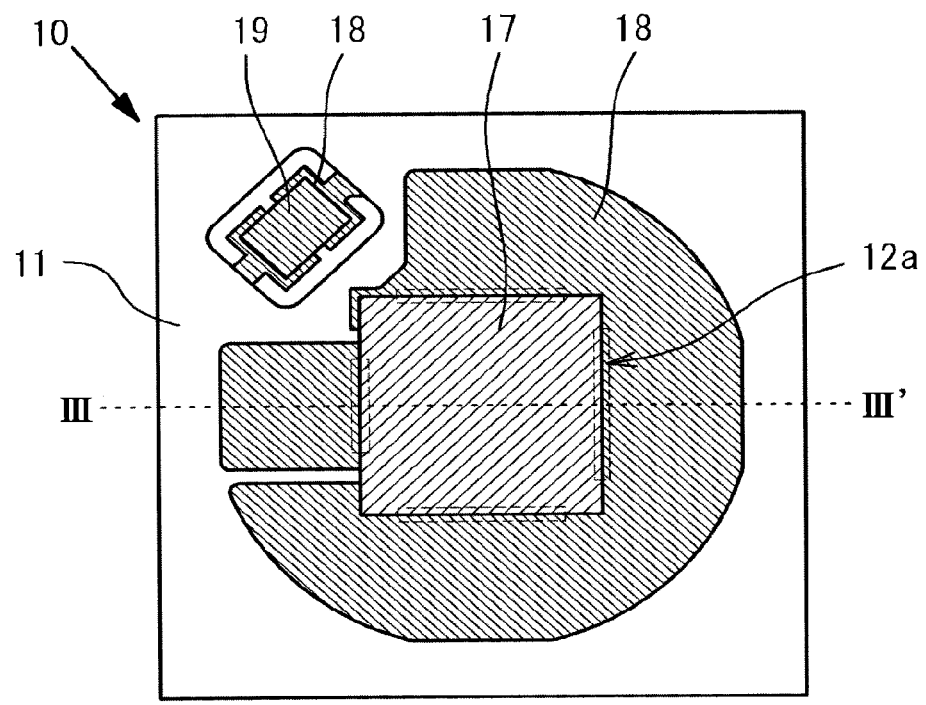
FIG. 5 is a schematic plan view showing an example of a light emitting device according to a third embodiment of the present invention.
Figure 6:
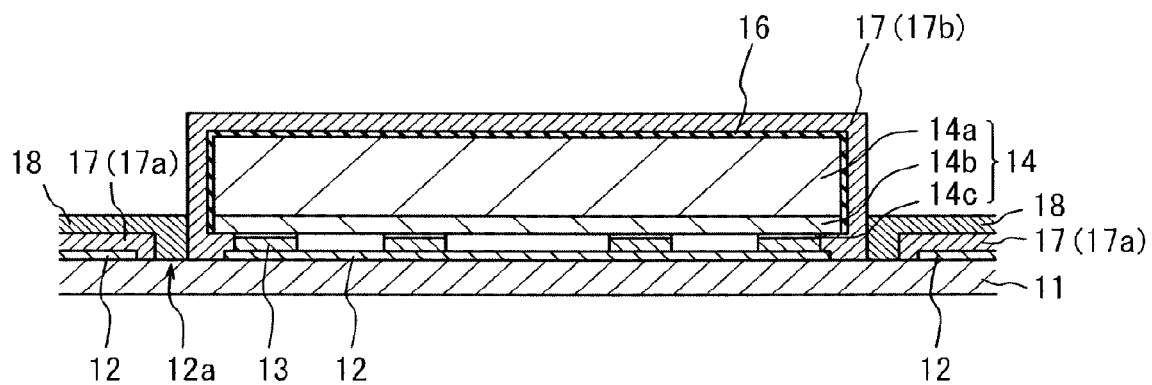
FIG. 6 is a schematic sectional view of the light emitting device taken along line III-III' of FIG. 5.

A light emitting device according to the third embodiment is described below. Descriptions of configurations identical to those of the light emitting device according to the first embodiment are omitted. FIG. 5 is a schematic plan view showing an example of the light emitting device according to the third embodiment of the present invention. FIG. 6 is a schematic sectional view of the light emitting device taken along line III-III' of FIG. 5.

In the light emitting device 10 according to the present embodiment, the conductive portion 12 is formed on the substrate 11, except for the area in which the protection element 19 is positioned, into a substantially circular shape centering the area in which the light emitting element 14 is positioned. The conductive portion 12 has grove shaped openings 12a along the outer edge of the light emitting element around the area in which the light emitting element 14 is positioned and the substrate 11 is partially exposed at the openings 12a. A phosphor layer 17a provided on the conductive portion 12 exposed around the light emitting element 14 and a phosphor layer 17b provided on the surface of the light emitting element are separated over the clear opening 12a.

The substrate 11 exposed at the opening 12a is preferably covered with the reflection layer 18. In case the reflection layer 18 is formed by using, for example, the electrodeposition method or the electrostatic coating method, the substrate 11 exposed at the opening 12a can be covered with the reflection layer 18 by forming the reflection layer 18 to be deposited on the conductive portion 12 neighboring the opening 12a thicker.

In the light emitting device of the present embodiment, the light emitted from the light emitting element 14 in the side direction can be prevented from traveling toward the phosphor layer 17a provided on the conductive portion 12 exposed around the light emitting element 14. Thus, the light extraction efficiency can be improved.

A width of each opening 12a in a direction vertical to the side surface of the light emitting element 14 may be a width that can separate the phosphor layer 17a provided on the conductive portion 12 around the light emitting element 14 from the phosphor layer 17b provided on the surface of the light emitting element over the opening 12a and can cover the substrate 11 exposed at the opening 12a with the reflection layer 18. The width of each opening 12a may be set to, for example, a range between 1 μm and 500 μm. The opening 12a is provided from the periphery of the area in which the light emitting element 14 is positioned to the inside of the area, so that an adverse effect caused due to mounting deviation of the light emitting element 14 can be reduced.

Fourth Embodiment

Figure 7:
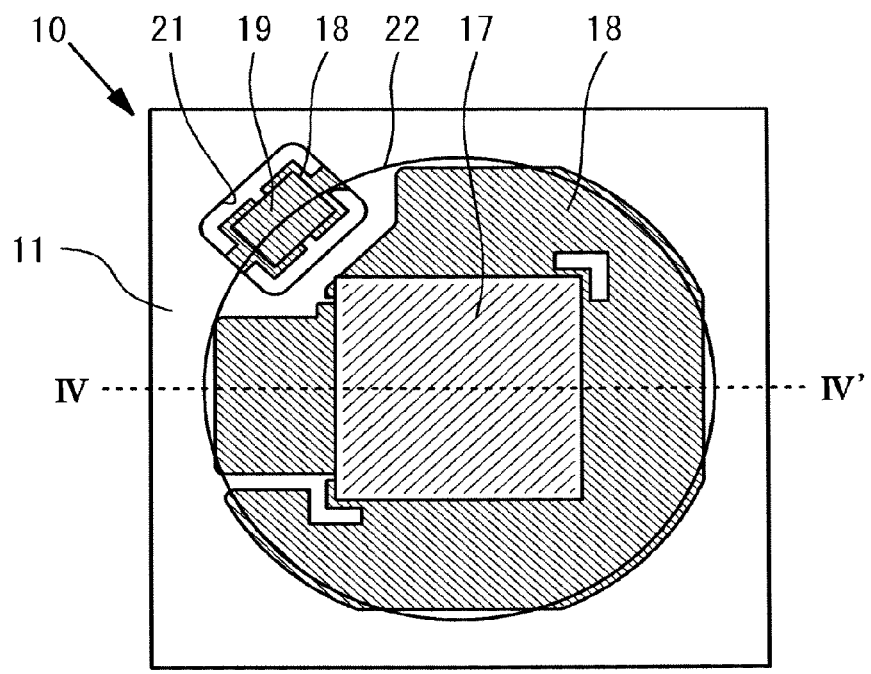
FIG. 7 is a schematic plan view showing an example of a light emitting device according to a fourth embodiment of the present invention.
Figure 8:
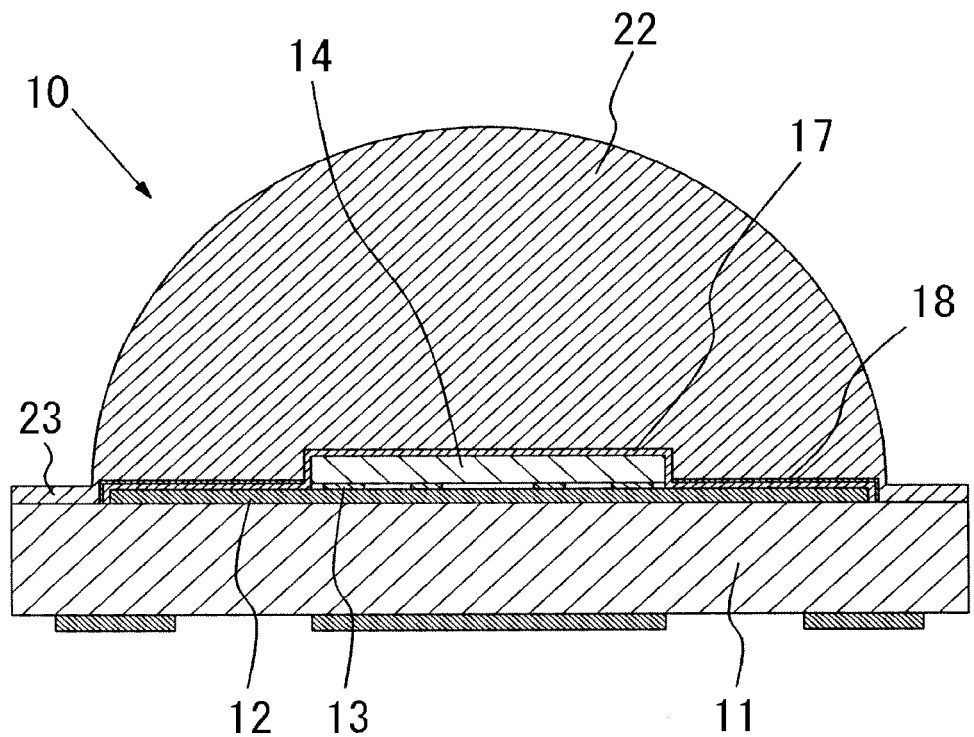
FIG. 8 is a schematic sectional view of the light emitting device taken along line IV-IV' of FIG. 7.

A light emitting device according to the fourth embodiment is described below. Descriptions of configurations identical to those of the light emitting device according to the first to third embodiments are omitted herein. FIG. 7 is a schematic plan view showing an example of the light emitting device according to the fourth embodiment of the present invention. FIG. 8 is a schematic sectional view of the light emitting device taken along line IV-IV' of FIG. 7.

The light emitting device 10 according to the present embodiment includes a convex shaped lens 22 covering the upper section of the light emitting element in addition to the components of the light emitting device formed in the same manner as the first and second embodiments. A collar section 23 formed into a flat shape is formed on a periphery of the lens 22. The collar section 23 is formed of the material identical to that of the lens 22.

As shown in FIG. 7, a contour of the substantially circular shaped conductive portion 12 is formed along a contour of the lens 22 in a planar view. In the area in which the protection element 19 is positioned, at least a portion of the area in which the reflection layer 18 is formed is positioned inside the area of the lens 22. Accordingly, the light emitting device of which light extraction efficiency is improved and which has excellent light distribution characteristics can be provided.

When forming the lens 22, the phosphor layer 17 and/or the reflection layer 18 may be impregnated with the material of the lens between the particles of the phosphor layer 17 and/or the reflection layer 18. Accordingly, the phosphor layer 17 and the reflection layer 18 can be prevented from being flaked. The impregnated layer may be formed such that, before forming the lens 22, the phosphor layer 17 formed on the light emitting element and/or the reflection layer 18 may be impregnated with a transparent material between the particles of the phosphor layer 17 and/or the reflecting member 18. In this case, it is preferable because the interfacial failure caused by the thermal expansion and thermal shrinkage can be prevented by using the material for forming the lens 22 as the material of the impregnated layer. By forming the impregnated layer before forming the lens 22, the material forming the lens 22 can be prevented from coming into the lower section of the light emitting element 14.

The lens may be formed also in the first to third embodiments.

EXAMPLES

Examples according to the present invention will be described below.

Example 1

Figure 9:
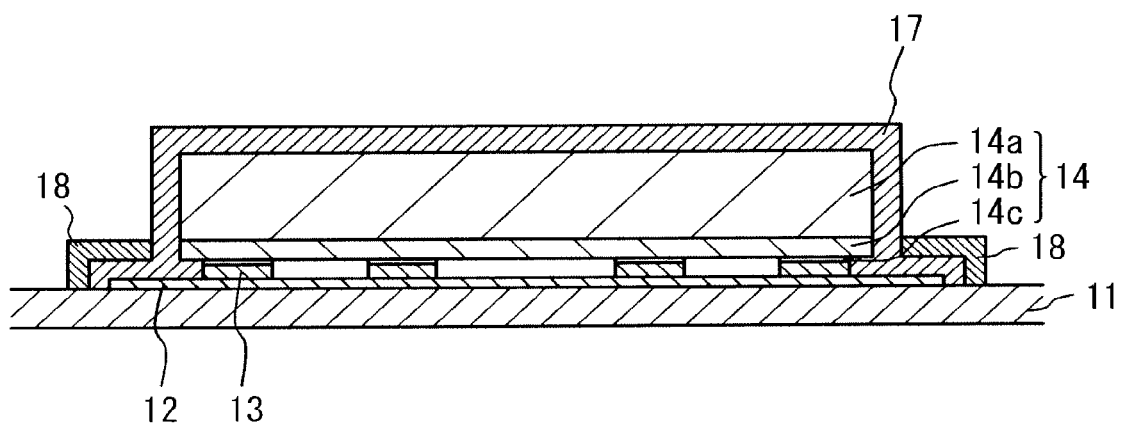
FIG. 9 is a schematic sectional view showing a light emitting device according to Example 1.

FIG. 9 is a schematic sectional view showing a light emitting device according to Example 1. The light emitting device includes the substrate 11 including the conductive portion 12, the bonding members 13, the light emitting element 14, the phosphor layer 17, and the reflection layer 18.

Alumina ceramics are used for forming the substrate 11 and Au is used for forming the conductive portion 12. The conductive portion 12 is partially embedded in the substrate 11. The conductive portion 12 functions as a terminal for electrically connecting the light emitting element 14 with the external power supply because the conductive portion 12 is exposed on a rear surface of the substrate 11.

The light emitting element 14 is connected to the conductive portion 12 by using bumps made of Au as the bonding members 13. The light emitting element 14 includes the substrate 14a made of sapphire having the insulating property and the semiconductor layer 14b formed on the substrate 14a. The covering layer 16 having the conductivity is made of Zn and is formed so as to cover the substrate 14a and the semiconductor layer 14b of the light emitting element 14. The phosphor layer 17 is made of, for example, YAG-based phosphor particles (having an average particle diameter of 8 μm) such that the phosphor particles are adhered on the surface of the covering layer 16, the surface of the semiconductor layer 14b of the light emitting element 14, and the conductive portion 12 around the light emitting element 14.

Since the phosphor particles are formed by the electrodeposition method, the phosphor particles can be adhered onto the covering layer 16 with a substantially uniform thickness.

The reflection layer 18 is formed such that $SiO_2$ particles (having an average particle diameter of 0.2 μm) are adhered by the electrodeposition method. At the time, the Zn is dissolved by using sulfate before forming the reflection layer 18 to remove the covering layer 16. Accordingly, the reflection layer 18 is not formed on the phosphor layer 17 formed on the light emitting element 14 but the reflection layer 18 is formed only on the phosphor layer 17 formed on the conductive portion 12.

According to the present Example, it is possible to obtain a light emitting device that causes less uneven light emission and also has improved light extraction efficiency.

Example 2

FIG. 1 is a schematic sectional view showing the light emitting device according to Example 2. Example 2 differs from Example 1 in that $A^1$ is used for forming the covering layer 16, the covering layer 16 is reformed so as to have the insulating property after forming the phosphor layer 17, and $TiO_2$ (having an average particle diameter of 0.3 μm) is used for forming the reflection layer 18. In the present Example, before forming the reflection layer 18, the covering layer 16 is oxidized to reform the covering layer 16 so as to have the insulating property by, for example, a method in which the covering layer 16 is heated under the water-vapor atmosphere. Accordingly, the reflection layer is not formed on the phosphor layer 17 formed on the light emitting element 14 through the covering layer 16 but the reflection layer 18 is formed only on the phosphor layer 17 formed on the conductive portion 12.

In the present Example, it is also possible to obtain a light emitting device that causes less uneven light emission and also has improved light extraction efficiency.

Example 3

Example 3 differs from Example 1 in that Sn—Ag—Cu is used as the bonding members 13 and Mg is used for forming the covering layer 16. The phosphor layer 17 has an average particle diameter of the phosphor particles of 5 μm and is formed by the electrostatic coating method. $Ba5O_4$ (having an average particle diameter of 0.5 μm) is used for forming the reflection layer 18. The other points are identical to those of Example 1.

In the present Example, it is also possible to obtain a light emitting device that causes less uneven light emission and also has improved light extraction efficiency.

Example 4

In Example 4, SiC having the conductivity is used for forming the substrate 14a of the light emitting element 14 and the covering layer 16 having the conductivity is not formed. ZnO (having an average particle diameter of 0.5 μm) is used for forming the reflection layer 18. Further, in the present Example, by impregnating the phosphor layer 17 formed on the light emitting element 14 with polymethyl methacrylate by the potting method after forming the phosphor layer 17, the reflection layer 18 is formed after forming the coating layer that has the insulating property and covers the surface of the substrate 14a having the conductivity. The other points are identical to those of Example 1.

In the present Example, it is also possible to obtain a light emitting device that causes less uneven light emission and also has improved light extraction efficiency.

Example 5

Example 5 differs from Example 4 in that Au—Sn is used as the bonding members 13, the average particle diameter of the phosphor particle of the phosphor layer 17 is set to 5 μm, and the phosphor layer 17 is formed by the electrostatic coating method.

In the present Example, it is also possible to obtain a light emitting device that causes less uneven light emission and also has improved light extraction efficiency.

Comparative Example

Figure 10:
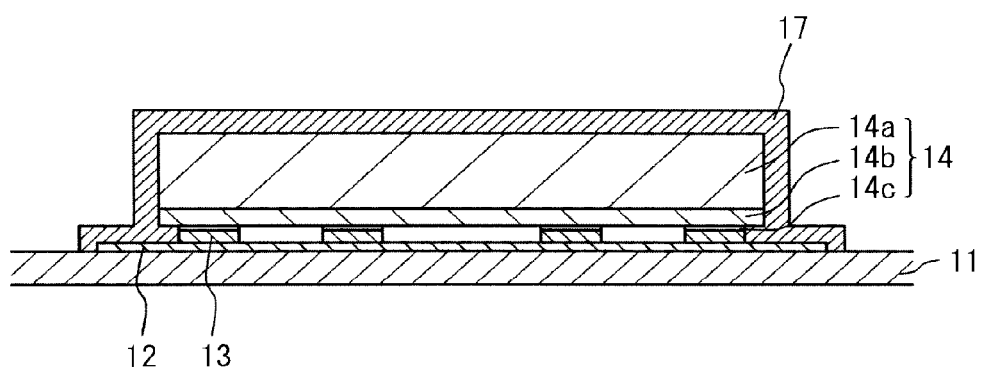
FIG. 10 is a schematic sectional view showing a light emitting device of Comparative Example.

As shown in FIG. 10 as Comparative Example, formed is a light emitting device having a configuration identical to that of Example 1 except that the reflection layer 18 is not formed.

An output relationship of the light emitting device obtained from each Example and the Comparative Example is shown in Table 1.

TABLE 1

| | Example 1 | Example 2 | Example 3 | Example 4 | Example 5 | Comparative example |
|---|---|---|---|---|---|---|
| Relative Output (%) | 104.3 | 104.1 | 103.5 | 103.3 | 103.1 | 100 |
| Rate of Increase (%) | 4.3 | 4.1 | 3.5 | 3.3 | 3.1 | — |

The relative output in Table 1 is a relative value of an output of the light emitting device of each Example when the output of the light emitting device of the reference Comparative Example is 100%. The output is obtained such that 70 light emitting devices having the identical configuration of each Example and the Comparative Example are prepared to be measured of each output, thereby taking an average value thereof. As shown in Table 1, the output improves in any Example as compared with the Comparative Example. The light emitting device of each Example can provide the uniform light emission.

Example 6

FIG. 7 is a schematic sectional view showing a light emitting device according to Example 6. The light emitting device includes the substrate 11 including the conductive portion 12, the bonding members 13, the light emitting element 14, the covering layer 16, the phosphor layer 17, the reflection layer 18, the protection element 19, and the lens 22.

The substrate 11, the bonding members 13, the light emitting element 14, the covering layer 16, the phosphor layer 17, and the reflection layer 18 can be formed into a configuration identical to that of any one of Examples 1 to 5, respectively.

The conductive portion 12 is formed on the substrate 11, except for the area in which the protection element 19 is positioned, into a substantially circular shape centering the area in which the light emitting element 14 is positioned. The conductive portion 12 includes Ti of a thickness of 0.1 μm, Cu of a thickness of 20 μm, Ni of a thickness of 1 μm, and Au of a thickness of 1 μm to be laminated together in this order from the bottom. As described above, the heat dissipation can be improved by forming a material having satisfactory thermal conductivity such as Cu into a thick film over a wide area.

In Example 6, after the phosphor layer 17 and the reflection layer 18 are formed, the impregnated layer is formed by impregnating the phosphor layer 17 with the transparent material between particles of the phosphor layer 17. A silicone resin is used for the transparent material.

Subsequently, the lens 22 is formed by compression molding. A silicone resin is used for forming the lens 22. According to the present Example, since the resin is prevented from being charged in the lower section of the light emitting element, the joint strength of the bonding area between the light emitting element and the conductive portion can be secured.

The light emitting device of the present invention is capable of reducing light absorption and realizing high output, and is also applicable to a wide range of uses, for example, various display devices, lighting equipment, displays, back light sources for liquid crystal displays, image readers used in a facsimile machine, a copying machine, and a scanner, and a projector.

This application claims the benefit of and priority to Japan Application No: 2011-065866, filed Mar. 24, 2011; Japan Application No: 2011-110876, filed May 17, 2011 and Japan Application No: 2012-064081, filed Mar. 21, 2012, all of which are incorporated herein by reference.

What is claimed is:
1. A light emitting device, comprising:
 a light emitting element having an upper surface, a lower surface opposed to the upper surface and lateral surfaces extending from the upper surface to the lower surface, the light emitting element including electrodes located at the lower surface side thereof;
 a transparent covering member that continuously and directly covers the upper surface of the light emitting element and on at least one lateral surface of the light emitting element but is separated from the electrodes, the transparent covering member being made of an insulating material;
 a phosphor layer covering at least the upper surface of the light emitting element via the transparent covering member; and
 a reflection member extending around a portion of lateral surfaces of the transparent covering member, the reflection member comprising a transparent material and a plurality of insulating reflective particles disposed in the transparent material, and wherein a width of the reflection member, measured from an inner periphery of the reflection member to an outer periphery of the reflection member, is smaller than an outer width of the light emitting element.

2. The light emitting device according to claim 1, wherein an upper surface of the reflection member is positioned lower than an upper surface of the phosphor layer.

3. The light emitting device according to claim 2, wherein the phosphor layer has a rectangular shape in a plan view of the light emitting device.

4. The light emitting device according to claim 2, wherein the phosphor layer has a uniform thickness.

5. The light emitting device according to claim 2, wherein the reflection member extends in an outward direction from the phosphor layer and the transparent covering member in a plan view of the light emitting device.

6. The light emitting device according to claim 2, wherein the reflection member has a shape of a quadrilateral in a plan view of the light emitting device.

7. The light emitting device according to claim 2, wherein a lower surface of the transparent covering member is positioned higher than a lowermost surface of the reflection member.

8. The light emitting device according to claim 1, wherein the phosphor layer has a rectangular shape in a plan view of the light emitting device.

9. The light emitting device according to claim 1, wherein the phosphor layer has a uniform thickness.

10. The light emitting device according to claim 1, wherein a thickness of the phosphor layer is in a range of about 0.1 µm to about 100 µm and a thickness of the reflection member is in a range of about 0.1 µm to about 100 µm.

11. The light emitting device according to claim 1, wherein a width of each electrode of the light emitting element, in a direction extending between the lateral surfaces of the light emitting element, is smaller than a width of the light emitting element in that same direction.

12. The light emitting device according to claim 1, wherein the reflection member extends in an outward direction from the phosphor layer and the transparent covering member in a plan view of the light emitting device.

13. The light emitting device according to claim 1, wherein the reflection member has a shape of a quadrilateral in a plan view of the light emitting device.

14. The light emitting device according to claim 1, wherein a lower surface of the transparent covering member is positioned higher than a lowermost surface of the reflection member.

15. The light emitting device according to claim 1, wherein the light emitting element comprises a semiconductor layer, and the electrodes are located directly on a surface of the semiconductor layer.

16. The light emitting device according to claim 1, wherein an overall outer width of the reflection member is larger than the outer width of the light emitting element.

17. The light emitting device according to claim 1, wherein the phosphor layer includes a first portion that directly covers an upper surface of the transparent covering member, a second portion that is continuous with the first portion and directly covers at least one lateral surface of the transparent covering member, and a third portion that is continuous with the second portion and directly covers a portion of the lower surface of the light emitting element.

18. The light emitting device according to claim 17, where the third portion of the phosphor layer also directly covers lateral surfaces of the electrodes.

19. A method for manufacturing a light emitting device, the method comprising:
providing a light emitting element having an upper surface, a lower surface opposed to the upper surface and lateral surfaces extending from the upper surface to the lower surface, the light emitting element including electrodes;
positioning the light emitting element such that the electrodes of the light emitting element are located at the lower surface side of the light emitting element;
forming a transparent covering member that continuously and directly covers the upper surface of the light emitting element and on at least one lateral surface of the light emitting element;
forming a phosphor layer such as to cover the upper surface of the light emitting element via the transparent covering member; and
forming a reflection member so as to extend around a portion of lateral surfaces of the transparent covering member, the reflection member comprising a transparent material and a plurality of insulating reflective particles disposed in the transparent material,
wherein the transparent covering member is formed such that the electrodes are separated from the transparent covering member,
wherein a width of the reflection member, measured from an inner periphery of the reflection member to an outer periphery of the reflection member, is smaller than an outer width of the light emitting element, and
wherein, in the manufactured light emitting device, the transparent covering member is made of an insulating material.

20. The method according to claim 19, wherein the phosphor layer has a rectangular shape in a plan view of the light emitting device.

21. The method according to claim 19, wherein an upper surface of the reflection member is positioned lower than an upper surface of the phosphor layer.

22. The method according to claim 21, wherein forming the transparent covering member is carried out before forming the reflection member.

23. The method according to claim 19, wherein the phosphor layer has a uniform thickness.

24. The method according to claim 19, wherein forming the transparent covering member is carried out before forming the reflection member.

25. The method according to claim 19, wherein a thickness of the phosphor layer is in a range of about 0.1 µm to about 100 µm and a thickness of the reflection member is in a range of about 0.1 µm to about 100 µm.

26. The method according to claim 19, wherein a width of each electrode of the light emitting element, in a direction extending between the lateral surfaces of the light emitting element, is smaller than a width of the light emitting element in that same direction.

27. The method according to claim 19, wherein the light emitting element comprises a semiconductor layer, and the electrodes are located directly on a surface of the semiconductor layer.

28. The method according to claim 19, wherein an overall outer width of the reflection member is larger than the outer width of the light emitting element.

29. The method according to claim 19, wherein the phosphor layer includes a first portion that directly covers an upper surface of the transparent covering member, a second portion that is continuous with the first portion and directly covers at least one lateral surface of the transparent covering member, and a third portion that is continuous with the second portion and directly covers a portion of the lower surface of the light emitting element.

30. The method according to claim 29, where the third portion of the phosphor layer also directly covers lateral surfaces of the electrodes.

\* \* \* \* \*